(12) United States Patent
Ono

(10) Patent No.: US 11,545,403 B2
(45) Date of Patent: Jan. 3, 2023

(54) SEMICONDUCTOR PACKAGE HAVING A MULTILAYER STRUCTURE AND A TRANSPORT TRAY FOR THE SEMICONDUCTOR STRUCTURE

(71) Applicant: SONY SEMICONDUCTOR SOLUTIONS CORPORATION, Kanagawa (JP)

(72) Inventor: Shogo Ono, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 44 days.

(21) Appl. No.: 17/250,542

(22) PCT Filed: Jun. 25, 2019

(86) PCT No.: PCT/JP2019/025179
§ 371 (c)(1),
(2) Date: Feb. 1, 2021

(87) PCT Pub. No.: WO2020/031530
PCT Pub. Date: Feb. 13, 2020

(65) Prior Publication Data
US 2021/0296188 A1    Sep. 23, 2021

(30) Foreign Application Priority Data
Aug. 9, 2018   (JP) .............................. JP2018-150911

(51) Int. Cl.
*H01L 23/04*   (2006.01)
*H01L 21/50*   (2006.01)
(Continued)

(52) U.S. Cl.
CPC .............. *H01L 23/04* (2013.01); *H01L 21/50* (2013.01); *H01L 21/673* (2013.01); *H01L 23/12* (2013.01); *H01L 23/31* (2013.01)

(58) Field of Classification Search
CPC ........ H01L 23/04; H01L 21/50; H01L 21/673
(Continued)

(56) References Cited

U.S. PATENT DOCUMENTS 4,709,991 A * 12/1987 Hoshikawa ........... G02F 1/1333
349/122
2006/0049488 A1   3/2006 Uchida
(Continued)

FOREIGN PATENT DOCUMENTS

| CN | 108352388 A | 7/2018 |
|----|----|----|
| JP | 11-251493 A | 9/1999 |

(Continued)

OTHER PUBLICATIONS

International Search Report and Written Opinion of PCT Application No. PCT/JP2019/025179, dated Sep. 3, 2019, 09 pages of ISRWO.

*Primary Examiner* — Quoc D Hoang
(74) *Attorney, Agent, or Firm* — Chip Law Group

(57) ABSTRACT

When a semiconductor package is stored in a transport tray and when a semiconductor package is transported by a transport tray, the semiconductor package comes into contact with the side wall of the transport tray, so that the end face of the semiconductor package is chipped and dust is generated from the end face of the semiconductor package. Provided is a technology for a semiconductor package that includes a multilayer structure having at least a synthetic resin layer and includes an outermost edge portion such that
(Continued)

the end face of the synthetic resin layer protrudes outward compared to the end faces of the other layers constituting the multilayer structure.

2 Claims, 4 Drawing Sheets

(51) Int. Cl.
 *H01L 21/673* (2006.01)
 *H01L 23/12* (2006.01)
 *H01L 23/31* (2006.01)
(58) Field of Classification Search
 USPC .................................................. 257/700, 701
 See application file for complete search history.

(56) References Cited

U.S. PATENT DOCUMENTS

2012/0273389 A1\* 11/2012 Aziz .................. B65D 11/1833
 414/800
2018/0350707 A1  12/2018 Kishida

FOREIGN PATENT DOCUMENTS

| JP | 2006-80284 | A | 3/2006 |
| JP | 2008-016604 | A | 1/2008 |
| JP | 2010-225648 | A | 10/2010 |
| JP | 2018-61000 | A | 4/2018 |
| WO | 2017/077792 | A1 | 5/2017 |
| WO | 2018/061481 | A1 | 4/2018 |

\* cited by examiner

SEMICONDUCTOR PACKAGE HAVING A MULTILAYER STRUCTURE AND A TRANSPORT TRAY FOR THE SEMICONDUCTOR STRUCTURE

CROSS REFERENCE TO RELATED APPLICATIONS

This application is a U.S. National Phase of International Patent Application No. PCT/JP2019/025179 filed on Jun. 25, 2019, which claims priority benefit of Japanese Patent Application No. JP 2018-150911 filed in the Japan Patent Office on Aug. 9, 2018. Each of the above-referenced applications is hereby incorporated herein by reference in its entirety.

TECHNICAL FIELD

The present technology relates to a semiconductor package, a transport tray that stores the semiconductor package, and a method of manufacturing the semiconductor package.

BACKGROUND ART

In recent years, due to the demand for miniaturization and high density of electronic devices and the like, and the accompanying miniaturization and the like of semiconductor packages, semiconductor packages with a so-called chip size package structure are used, the size of the semiconductor packages having been made as close as possible to the size of a semiconductor chip.

Moreover, in order to improve production efficiency, a so-called wafer level package technique has been proposed, in which, after a plurality of semiconductor chips is formed, the semiconductor chips are packaged in a wafer state in a batch, and then individualized to obtain semiconductor packages. A semiconductor package having a chip size package structure manufactured by such a technique is generally called a wafer level chip size package (WLCSP for short). Note that the step of individualizing a wafer in order to obtain a semiconductor package is also called a dicing step, which is performed by processing such as, for example, dividing, separating, cutting, and machining.

A process of manufacturing a semiconductor package has been conventionally performed in the following order. That is, the process of manufacturing a semiconductor package includes a dicing step of individualizing a semiconductor chip having a circuit pattern from a wafer, a mounting step of placing the semiconductor chip on a lead frame and the like, a wire bonding step of wire connecting between the semiconductor chip and the lead frame, and a molding step of coating and sealing the wire-bonded semiconductor chip and the lead frame with a resin or the like. However, in recent years, a technique called flip-chip packaging may be performed, in which, without using the lead frame and the wire bonding, a semiconductor chip is inverted, and a bump including a solder ball, for example, is placed on a pad formed on the back surface of the semiconductor chip, thereby forming terminals to be connected to the outside and wiring the semiconductor chip. In the wafer level package technique, in general, a wafer is wired in the state of the wafer before individualization by using the flip-chip packaging technique, and is individualized after undergoing a step such as a molding step.

In these semiconductor packages, in order to make the size of a semiconductor package as close as possible to the size of a semiconductor chip, the entire semiconductor package, particularly the surface other than an electrode surface and the opposite surface of the semiconductor package, is not sealed with resin or the like, and the semiconductor chip may be exposed. Therefore, when such a semiconductor package is stored in a tray for transportation, there is a problem that the end face of the semiconductor package rubs against the side wall of the tray and dust is generated. Furthermore, there is a problem that the end face of the semiconductor package comes into contact with the side wall of the tray due to vibration when the semiconductor package is stored in the tray and transported, and the semiconductor package is chipped. Many techniques have been disclosed for countermeasures against these problems.

Patent Document 1 discloses a technique for a semiconductor package provided with a semiconductor element on which a protrusion electrode is formed and a sealing resin layer on the surface of the protrusion-electrode-forming side, in which the semiconductor package has a stepped portion formed on the outer periphery of the semiconductor package and the sealing resin layer.

Patent Document 2 discloses a technique for a semiconductor element having a cubic shape and having a protective resin layer formed on a part of each of four surfaces except a surface having an electrode and a surface opposite to the surface having the electrode.

However, the techniques disclosed in the prior art documents are not desirable from the viewpoint of productivity because it is necessary to add a new processing step in order to solve the above-described problems.

CITATION LIST

Patent Document

Patent Document 1: Japanese Patent Application Laid-Open No. H11-251493
Patent Document 2: Japanese Patent Application Laid-Open 2008-016604

SUMMARY OF THE INVENTION

Problems to be Solved by the Invention

It is therefore an object of the present technology to provide a technique in which, in a semiconductor package individualized from a wafer, chipping is not occurred, and dust is not generated without adding a new processing step.

Solutions to Problems

The present technology provides a technique for a semiconductor package that includes a multilayer structure having at least a synthetic resin layer and includes an outermost edge portion such that an end face of the synthetic resin layer protrudes outward compared to the end faces of the other layers constituting the multilayer structure. According to one embodiment of the present technology, the synthetic resin layer may be included between a glass layer and a silicon layer. The present technology provides a technique for a transport tray for the semiconductor package, which has a plurality of storage parts that stores the semiconductor package according to one embodiment of the present technology and has the semiconductor package stored in the storage part. The present technology provides a method of manufacturing a semiconductor package, in which the semiconductor package is individualized by a first step where a first groove is formed from one surface of a wafer to the synthetic resin layer, and by a second step where the second groove is formed from the other surface of the wafer until the second groove communicates with the deepest portion of the first groove of the synthetic resin layer so that the end face of the synthetic resin layer includes an outermost edge portion protruding outward compared to the end faces of the other layers constituting the multilayer structure. Furthermore, in the present technology, in accordance with one embodiment of the present technology, the first groove of the first step and the second groove of the second step may be formed by any one of or a combination of laser-machining, grindstone-machining, and wet-etching.

Here, a semiconductor package refers to a semiconductor chip that is packaged after wiring to form terminals for connecting the previous term semiconductor chip to the outside and sealing to cover the wiring lines and the like with a resin and the like. The semiconductor chip may be included in a multilayer structure.

The present technology can have effects of suppressing generation of dust due to a semiconductor package rubbing against a wall of a tray for transportation when the semiconductor package is stored in the tray, and suppressing occurrence of chipping in the end face of the semiconductor package due to the semiconductor package vibrating and coming into contact with the side wall of the tray when the semiconductor package is stored in the tray and transported. Furthermore, because it is not necessary to add a new step in order to obtain the above-described advantageous effect, the productivity is not lowered.

MODE FOR CARRYING OUT THE INVENTION

Hereinafter, preferred modes for carrying out the present technology will be described. It should be noted that the embodiments described below show typical embodiments of the present technology, and the present technology should not be limited to these embodiments. Note that the present technology will be described in the following order.

Figure 1:
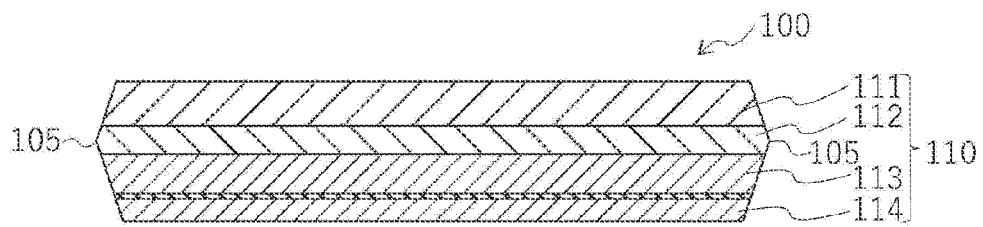
FIG. 1 is a diagram showing an example of a semiconductor package according to a first embodiment of the present technology.

1. An example of a semiconductor package of a first embodiment
2. An example of a semiconductor package of a second embodiment
3. Description of the effect of the semiconductor package
4. An example of a transport tray storing the semiconductor package of the first embodiment.
5. An example of a transport tray storing the semiconductor package of the second embodiment
6. An example of a method of manufacturing the semiconductor package of the first embodiment
7. A modification of the method of manufacturing the semiconductor package of the first embodiment
8. An example of a method of manufacturing the semiconductor package of the second embodiment 1. An Example of a Semiconductor Package of a First Embodiment An example of a semiconductor package according to the present technology will be described below with reference to FIG. 1. FIG. 1 is a schematic cross-sectional view of a semiconductor package 100 according to the present technology.

As described above, the semiconductor package 100 according to the present technology employs a structure in which the size after packaging is as close as possible to the size of an internal semiconductor chip, that is, a so-called chip size package structure. Further, so-called wafer level chip size packaging technology is employed, in which packaging in the state of a wafer and subsequent individualizing are performed. That is, although a semiconductor package according to conventional technology has a sealing portion for the purpose of protecting a semiconductor chip from an external impact and the like, the semiconductor package 100 according to the present technology does not have a sealing portion for covering the semiconductor chip.

The semiconductor package 100 according to the present technology includes a multilayer structure 110 having at least a synthetic resin layer 112 and includes an outermost edge portion 105 protruding outward compared to the end faces of the other layers constituting the multilayer structure 110 on the end face of the semiconductor package 100. Thereby, when the semiconductor package 100 is stored in a tray for transportation, it is possible to suppress the generation of dust due to rubbing against the side wall 351 of the tray, and furthermore, when the semiconductor package 100 is stored in the tray and transported, it is possible to prevent the end face of the semiconductor package 100 from being chipped due to coming into contact of the end face of the semiconductor package with the side wall of the tray caused by vibration and the like.

The semiconductor package 100 shown in FIG. 1 has at least the multilayer structure 110 including a glass layer 111, a synthetic resin layer 112, a silicon layer 113, and a wiring layer 114. The synthetic resin layer 112 is located between the glass layer 111 and the silicon layer 113 and includes the outermost edge portion 105 such that the end face of the synthetic resin layer 112 protrudes outward compared to the end faces of the other layers constituting the multilayer structure 110. The outermost edge portion 105 may further have a pointed shape.

The glass layer 111 has a role of transmitting light from the outside and/or the silicon layer 113 side. The material of the glass layer 111 is not particularly limited as long as it transmits light, but it may be a material that transmits visible light, including, for example, silicon dioxide (SiO2) and borosilicate crown glass (so-called BK7), as well as sapphire (AL2O3), barium fluoride (BaF2), lithium fluoride (LiF), and magnesium fluoride (MgF2). Furthermore, it may be, for example, a material including zinc selenium (ZnSe), silicon (Si), or the like.

Furthermore, the material of the glass layer 111 may be a transparent plastic resin material. In a case where the material of the glass layer 111 is a transparent plastic resin material, the layer including the outermost edge portion 105 protruding outward compared to the end faces of the other layers constituting the multilayer structure 110 may be a layer of a material having the higher elastic modulus of the transparent plastic resin material and the material of the synthetic resin layer 112.

The synthetic resin layer 112 is located between the glass layer 111 and the silicon layer 113, and has a role of transmitting light. The material of the synthetic resin layer 112 is not particularly limited as long as it allows light to pass through and has elasticity. Furthermore, the material of the synthetic resin layer 112 may have light transparency and airtightness, and also may have a property of being able to stick the material of the glass layer 111 and the material of the silicon layer 113 together.

The material of the synthetic resin layer 112 may contain, for example, a phenolic material. The material of the synthetic resin layer 112 may contain a rubber-based material.

The thickness of the synthetic resin layer 112 can be, for example, 25 um to 100 um.

The silicon layer 113 has a role of converting the light transmitted mainly through the glass layer 111 and the synthetic resin layer 112 into an electric signal. The silicon layer 113 may have an element for photoelectric conversion on the surface in contact with the synthetic resin layer 112. The material of the silicon layer 113 is not particularly limited as long as it has the properties of a semiconductor, but may include, for example, silicon (Si) and germanium (Ge). Furthermore, the material of the silicon layer 113 may be silicon carbide (SiC). Furthermore, the silicon layer 113 may have a role of radiating light toward the synthetic resin layer 112 side.

The wiring layer 114 has a role of supplying power to the semiconductor package 100 and inputting and outputting electric signals from and to the outside. The wiring layer 114 includes a circuit part formed for the above-described role, an electrode, and wiring lines on the surface of the wiring layer 114, which are sealed with, for example, an insulating material. A formation of the wiring layer 114 may be performed by a method that is generally used, and the manufacturing method is not particularly limited. The wiring layer 114 may be further provided with an insulating layer on the face in contact with the silicon layer 113 for electrically insulating.

2. An Example of a Semiconductor Package of a Second Embodiment

Figure 2:
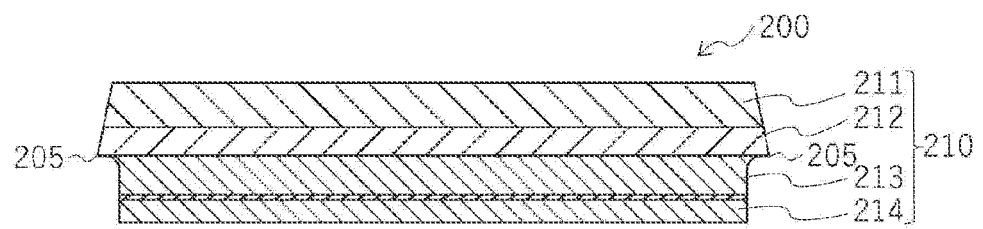
FIG. 2 is a diagram showing an example of a semiconductor package according to a second embodiment of the present technology.

An example of a second embodiment of a semiconductor package according to the present technology will be described below with reference to FIG. 2. FIG. 2 is a schematic cross-sectional view of the semiconductor package of the second embodiment according to the present technology.

A semiconductor package 200 shown in FIG. 2 has at least a multilayer structure 210 including a glass layer 211, a synthetic resin layer 212, a silicon layer 213, and a wiring layer 214, and includes an outermost edge portion 205 such that the end face of the synthetic resin layer 212 protrudes outward compared to the end faces of the other layers constituting the multilayer structure. The outermost edge portion 205 of the semiconductor package 200 may further have a pointed shape. The end faces of the silicon layer 213 and the wiring layer 214 of the semiconductor package 200 are substantially vertical, and there is a step on the end face of the silicon layer 213 and the outermost edge portion 205 of the synthetic resin layer 212. The step at the end face of the silicon layer 213 in contact with the synthetic resin layer 212 may have an inner R shape. In the semiconductor package 200, the end faces of the silicon layer 213 and the wiring layer 214 of the semiconductor package 200 may be formed by wet-etching. Others are the similar to the example of the semiconductor package of the first embodiment and will be therefore omitted.

Moreover, the end face of the glass layer 211 of the semiconductor package 200 is substantially vertical, and there may be a step on the end face of the glass layer 211 and the outermost edge portion 205 of the synthetic resin layer 212. The step on the end face of the silicon layer 213 with the synthetic resin layer 212 may have an inner R shape. In the end face of the semiconductor package 200, the end faces of the glass layer 211 and the synthetic resin layer 212 may be formed by wet-etching.

3. Description of the Effect of the Semiconductor Package According to the Present Technology The explanation of the effects of the semiconductor package 100 and the semiconductor package 200 according to the present technology will be described. Note that, a case where a wafer 300 is placed on an adhesive tape 320 provided with a frame 330 will be described below, but the wafer 300 may be placed on a jig on which a plurality of pins is arranged, without using the adhesive tape 320.

Figure 3:
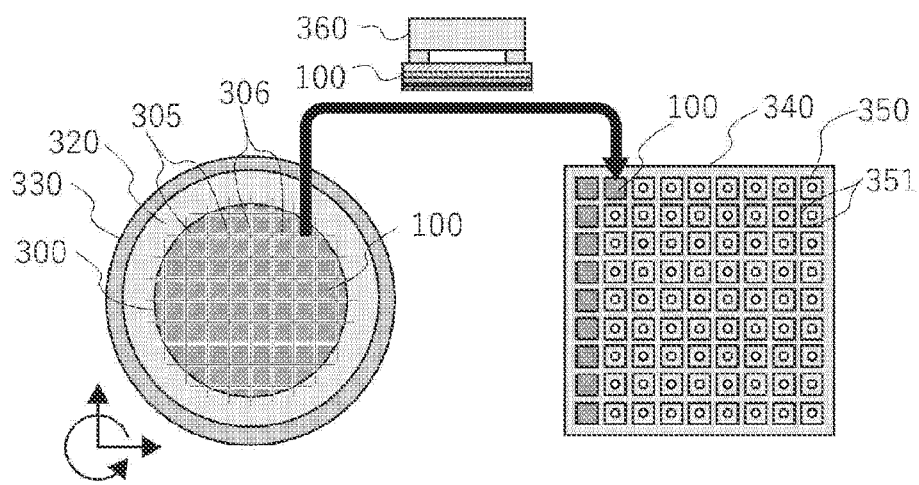
FIG. 3 is a top view showing how the semiconductor package of the first embodiment according to the present technology is transferred to a transport tray.

Transfer to a transport tray 340 will be described with reference to FIG. 3. The frame 330 and the wafer 300 are placed on the adhesive tape 320. As described above, the wafer 300 has a multilayer structure 310 including at least a glass layer 311, a synthetic resin layer 312, a silicon layer 313, and a wiring layer 314.

The wafer 300 is individualized after a groove 306 is formed along a street 305 formed on the surface of the wiring layer 314. The street 305 is a gap in a circuit part of each semiconductor package 100, and the gap serves as a processing allowance for forming the groove 306 in individualization. The groove 306 is formed in the street 305 formed on the surface of the wiring layer 314, and individualization is performed to form the semiconductor package 100. The semiconductor package 100 is separated from the adhesive tape 320 by being picked up by a transfer collet 360 and lifted vertically. The picking-up by the transfer collet 360 is performed, for example, by vacuum-sucking the top face of the semiconductor package 100.

Note that, in the picking-up, the individualized wafer 300 may be picked up in a state where the adhesive tape 320 is pulled to extend the distance between the semiconductor packages 100. Thereby, even in a case where the groove 306 formed at the time of individualization is narrow, the distance between the adjacent semiconductor packages 100 can be increased, and the risk of the semiconductor packages 100 rubbing against each other during picking-up can be eliminated.

Furthermore, the picking-up may be performed in a state where the adhesive tape 320 is subjected to, for example, UV irradiation to weaken the adhesive force of the adhesive tape 320. Thereby, even in a case where the adhesive strength with the adhesive tape 320 is strong, the adhesive strength is weakened in the picking-up, and the semiconductor package 100 can be reliably picked up.

Figure 4:
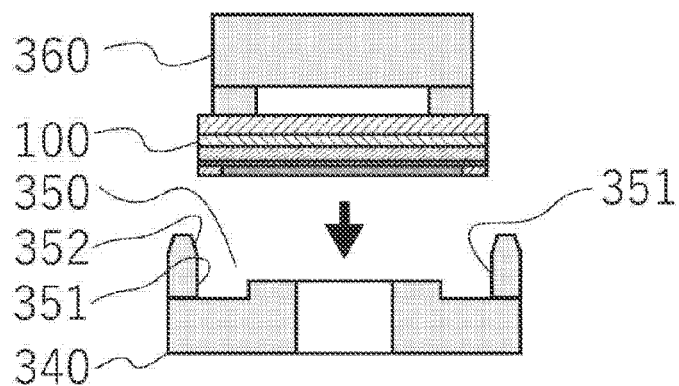
FIG. 4 is a side view showing how the semiconductor package of the second embodiment according to the present technology is stored in the transport tray.

Next, storing the semiconductor package 100 according to the present technology into the transport tray 340 will be described with reference to FIG. 4. The semiconductor package 100 picked up from the individualized wafer 300 by the transfer collet 360 is transported above a predetermined storage part 350 in which the transport tray 340 is to be stored, and is lowered to the height of the storage part 350, and then released from the transfer collet 360, for example, by releasing the vacuum, to be stored in the storage part 350. Therefore, it is desirable that one surface of the first step of the manufacturing method according to the present technology is the surface of the wiring layer 114, and the other surface of the second step is the surface of the glass layer 111. By using the surface of the glass layer 111 as the surface to be processed in the second step, it is possible to omit the step of inverting the wafer 300 or the semiconductor package 100 after the second step and before transfer to the transport tray, and thus productivity is not lowered.

4. An Example of a Transport Tray Storing the Semiconductor Package of the First Embodiment A transport tray 500 storing the semiconductor package 100 according to the present technology will be described below with reference to FIG. 5. In the transport tray 500, the semiconductor package 100 is stored in a transport tray 340. The transport tray 500 includes the transport tray 340 and the semiconductor package 100. The transport tray 340 is provided with a plurality of the storage parts 350 for the semiconductor package and the storage parts 350 store the semiconductor package 100. Note that FIG. 6 shows a transport tray 600 storing the semiconductor package 200 according to the present technology. Since the transport tray 600 replaces the semiconductor package 100 stored in the transport tray 500 and the transport tray 340 shown in FIG. 5 with the semiconductor package 200, the description thereof will be omitted.

The horizontal dimension of the storage part 350 is slightly larger than the horizontal dimension of the semiconductor package 100. When the semiconductor package 100 is picked up and stored in the transfer collet 360, since the horizontal dimension of the storage part of the transport tray 340 is slightly larger than the horizontal dimension of the semiconductor package 100, the end face of the semiconductor package 100 does not come into contact with the side wall 351 of the transport tray 340, and furthermore, the semiconductor package 100 does not move significantly in the storage part 350 during transport. Therefore, the semiconductor package can be stored and transported without being damaged. That is, productivity is not lowered.

Figure 5:
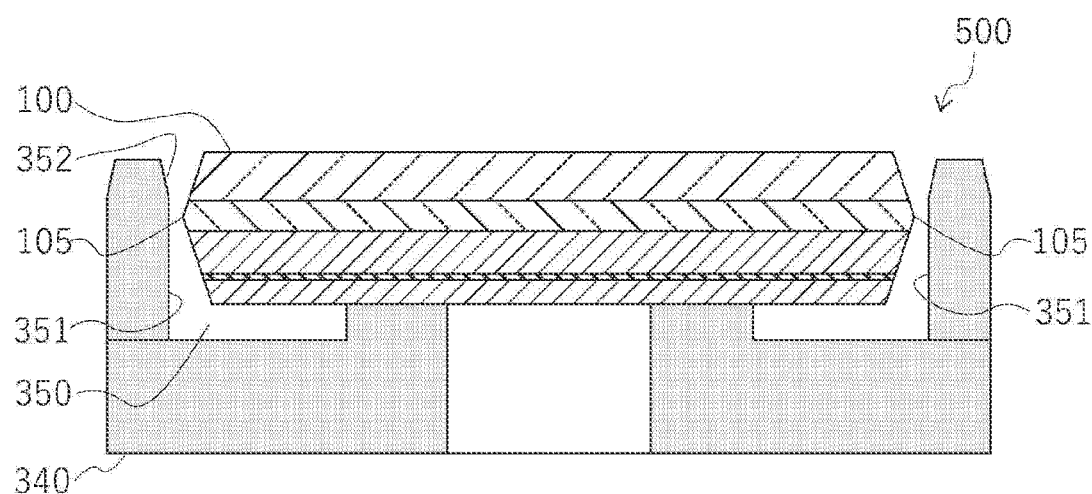
FIG. 5 is a diagram showing an example of the transport tray storing the semiconductor package of the first embodiment according to the present technology.
Figure 6:
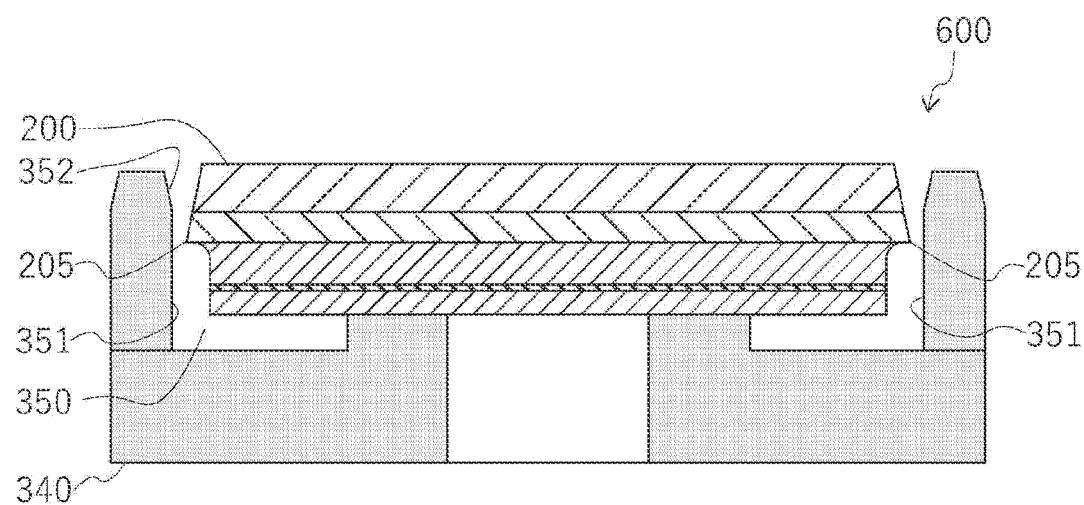
FIG. 6 is a diagram showing an example of the transport tray storing the semiconductor package of the second embodiment according to the present technology.

The transport tray 340 shown in FIG. 5 has a plurality of storage parts 350 that stores the semiconductor package 100. Basically, one semiconductor package 100 is stored in one storage part 350. The horizontal dimension of the storage part 350 is slightly larger than the horizontal dimension of the semiconductor package 100. Thereby, when the semiconductor package 100 is stored in the storage part 350, the semiconductor package 100 does not come into contact with the side wall 351, and when the semiconductor package 100 is transported with the transport tray 500, the semiconductor package 100 does not move significantly within the storage part 350.

Since the end face of the semiconductor package 100 has the outermost edge 105 from the synthetic resin layer 112, even if the end face of the semiconductor package 100 and the side wall 351 come into contact with each other, the semiconductor package 100 is not chipped. Furthermore, even if the end face of the semiconductor package 100 rubs against the side wall 351, the generation of dust can be suppressed.

The transport tray 340 may have a hole in the bottom face of the storage part 350. Due to having the hole, when the semiconductor package 100 stored in the storage part is taken out, the semiconductor package 100 can be lifted up and taken out from below with a rod-shaped object. Furthermore, the portion of the bottom face of the storage part 350 of the transport tray 340 on which the semiconductor package 100 is loaded may be one step higher. Thereby, the semiconductor package 100 can be horizontally stored in the storage part 350 by only leveling the portion on which the semiconductor package 100 is to be loaded. Moreover, a corner portion 352 at the upper end of the side wall 351 of the transport tray 340 may be chamfered. Thereby, when the semiconductor package 100 is stored, even in a case where the end face of the semiconductor package 100 and the upper end of the side wall 351 of the transport tray 340 come into contact with each other, generation of dust and occurrence of chipping from the end face of the semiconductor package 100 can be suppressed.

The material of the transport tray 340 is not particularly limited as long as it is a resin material generally used, and it may be, for example, polystyrene (PS), polypropylene (PP), acrylonitrile butadiene styrene (ABS), polyphenylene ether (PPE), polyphenylene sulfide (PPS), polyethersulfone (PES), polyetheretherketone (PEEK), or other resin materials of biodegradable materials. Furthermore, the resin material may be a resin material in which, for example, carbon black, carbon fiber, ceramic fiber, or the like is added to the above-mentioned resin material to impart conductivity. By making the material of the transport tray 340 conductive, it is possible to prevent static electricity from accumulating in the transport tray 340 and prevent the semiconductor package 100 from being electrostatically destroyed. Furthermore, the material of the transport tray 340 may be a resin material having heat resistance.

The transport tray 340 may be made by so-called injection molding, in which the resin material is molded by injection into a mold.

Here, in a case where the size of the semiconductor package 100 follows JEDEC standards, the standardized and predetermined transport tray 340 may be used. Therefore, it is not necessary to prepare the transport tray 340 for every semiconductor package 100, so that productivity can be improved.

The semiconductor package 100 according to the present technology has the protruding outermost edge 105 of the synthetic resin layer 112 on the end face of the semiconductor package 100. The material of the synthetic resin layer 112 has a higher elastic modulus than that of the materials of the other layers constituting the multilayer structure 310. Therefore, for example, even in a case where the end face and the like of the semiconductor package 100 come into contact with the side wall 351 of the transport tray 340, it is possible to suppress the generation of dust from the end face of the semiconductor package 100 and the occurrence of chipping of the end face of the semiconductor package. A case where the end face of the semiconductor package 100 comes into contact with the transport tray 340 includes a case where the semiconductor package 100 picked up by the transfer collet 360 comes into contact with the top corner 352 of the side wall 351 of the transport tray 340 when descending to the height of the storage part 350 of the transport tray 340, and a case where the stored semiconductor package 100 comes into contact with the side wall 351 of the storage part 350 of the transport tray 340 due to vibration-induced movement during transportation.

The end face of the semiconductor package 100 may further have a pointed end at the outermost edge portion 105. Due to the pointed end of the outermost edge portion 105 of the end face of the semiconductor package 100, even in a case where the semiconductor package 100 comes into contact with and rubs against the side wall 351 of the transport tray 340, it is possible to suppress the generation of dust from the end face of the semiconductor package and the occurrence of chipping of the end face of the semiconductor package.

5. An Example of a Transport Tray Storing the Semiconductor Package of the Second Embodiment A transport tray 600 storing the semiconductor package 200 of the second embodiment according to the present technology will be described below with reference to FIG. 6. A transport tray 340 has a plurality of storage parts 350 that stores the semiconductor package 200. The semiconductor package 200 is stored in the storage part 350 of the transport tray 340 shown in FIG. 6. One semiconductor package 100 is stored in one storage part 350, basically. In the semiconductor package 200, since there is the side wall 351, the semiconductor package 100 stored in the storage part 350 is restricted from moving within the storage part 350 and does not come into contact with other semiconductor packages 100.

Since the end face of the semiconductor package 200 has the outermost edge 205 formed with the synthetic resin layer 212, the semiconductor package 200 is not chipped even if the end face of the semiconductor package 200 and the side wall 351 come into contact with each other. Furthermore, even if the end face of the semiconductor package 200 rubs against the side wall 351, the generation of dust can be suppressed.

Others are the similar to the example of the transport tray storing the semiconductor package of the first embodiment and will be therefore omitted.

Figure 7A:
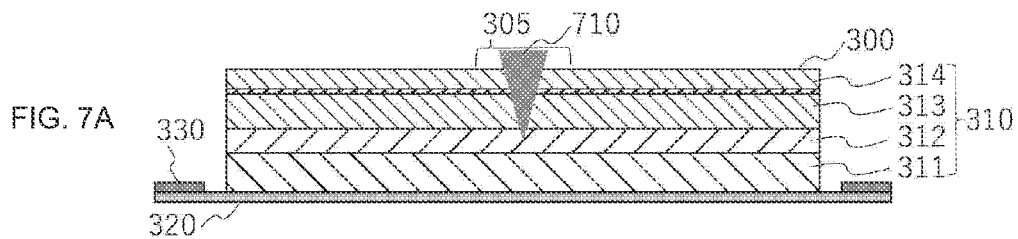
FIGS. 7A, 7B, and 7C are diagrams showing an example of a method of manufacturing the semiconductor package according to the first embodiment according to the present technology.

6. An Example of a Method of Manufacturing the Semiconductor Package of the First Embodiment A method of manufacturing the semiconductor package 100 according to the present technology will be described below with reference to FIGS. 7A, 7B, and 7C. In FIG. 7A, the wafer 300 and the frame 330 are placed on the adhesive tape 320. The configuration of the wafer 300 has the multilayer structure 310 including the glass layer 311, the synthetic resin layer 312, the silicon layer 313, and the wiring layer 314.

In the method of manufacturing the semiconductor package 100 according to the present technology, a first groove 711 is formed in the wafer 300 by laser-machining in a first step, and a second groove 721 is formed in the wafer 300 by laser-machining in a second step. Furthermore, in the method of manufacturing the semiconductor package 100 according to the present technology, description will be made for a case where the surface of the wafer 300 to be processed in the first step is the surface of the wiring layer 114 side, and the surface of the wafer 300 to be processed in the second step is the surface of the glass layer 111 side. In the method of manufacturing the semiconductor package 100 according to the present technology, the first step and the second step may be performed at the same time.

Note that, in the example of the method of manufacturing the semiconductor package 100 of the first embodiment according to the present technology, the processing related to the first step may be performed by any one of laser-machining, grindstone-machining, and wet-etching, or a combination thereof. Furthermore, the processing related to the second step may be performed by any one of laser-machining, grindstone-machining, and wet-etching, or a combination thereof. For example, in the first step, a groove may be formed in the street 305 on the surface of the wiring layer 314 by laser-machining, and then the groove is further grindstone-machining or wet-etched until the groove reaches the synthetic resin layer 312, and thus forming the first groove 711. Alternatively, for example, a groove may be formed in the street 305 on the surface of the wiring layer 314 by grindstone-machining on the surface of the wafer 300, and then the groove is further laser-machined or wet-etched until the groove reaches the synthetic resin layer 312, thus forming the first groove 711. Alternatively, for example, a groove may be formed in the street 305 on the surface of the wiring layer 314 by wet-etching, and then the groove is further laser-machined or grindstone-machining until the groove reaches the synthetic resin layer 312, and thus forming the first groove 711. In this way, by processing the first groove related to the first step in combination with a plurality of processing methods, the quality or/and speed of processing can be further improved.

In the example of the method of manufacturing the semiconductor package 100 of the first embodiment according to the present technology, in the first step, after forming grooves on both outer edges of the street 305 of a circuit pattern formed on the surface of the wiring layer 314 on the surface of the wafer 300 by laser-machining, a groove reaching the silicon layer 113 is formed in the center of the street 305 by grindstone-machining using a thick grindstone blade 810. Thereafter, by grindstone-machining using a thin grindstone blade 810, a groove reaching the synthetic resin layer 312 may further be formed in the center of the street 305, and thus forming the first groove 711.

The principle of laser-machining is that, in laser-machining using a laser beam 710 with a short pulse width, in general, when a workpiece is irradiated with the laser beam 710, the part of the workpiece irradiated with the laser beam 710 absorbs the energy of the laser beam 710. Thereby, the part of the workpiece irradiated with the laser beam 710 instantly melts and evaporates to generate induced plasma, and by a pressure wave generated at the same time, the minute melted part of the part irradiated with the laser beam 710 of the workpiece is explosively removed. Depending on the pulse width of the laser beam used in the laser-machining, the material of the part irradiated with the laser beam 710 may locally melt or vaporize, and thus a groove is formed. The part of the workpiece irradiated with the laser beam 710 melts or vaporizes and may resolidify, which is also called debris. In this way, the processing of irradiating the surface of the workpiece with the laser beam 710 and utilizing the phenomenon that the constituent substances on the surface of the workpiece are explosively released with the generation of induced plasma is also called laser ablation processing.

In addition to the pulse width of the laser beam 710, the processing conditions in the laser-machining include, for example, wavelength, energy output, and frequency of the laser beam 710. The wavelength of the laser beam 710 differs depending on the material of a workpiece, and one that is easily absorbed by the material of a workpiece is used. Other processing conditions of laser-machining is determined by, in addition to the wavelength of the laser beam 710, the ease of absorbing the energy of the laser beam 710 on the surface of a workpiece, the ease of propagating the energy within a workpiece, the thickness of a workpiece, the amount of laser-machining removal, the quality of processing such as the ease of scattering or discharging of debris, as well as the time required for processing.

Next, the formation of a groove by laser-machining will be described. The processing of forming a groove with the laser beam 710 basically positions the focus of the laser beam 710 on the surface of a workpiece to form a hole from the surface to a predetermined depth, and then positions the focus on the bottom face of the hole to further form a hole from the bottom face of the hole to a predetermined depth in the vicinity of the bottom face of the hole. By repeating these steps, a hole with the final required depth is formed. At this time, the area around the part of the workpiece irradiated with the laser beam 710 is also thermally affected by the energy of the laser beam 710, the energy being thermally conducted from the part irradiated with the laser beam 710. That is, the closer to an emission port of the laser beam 710 on the workpiece, the longer a period of time for obtaining energy from the laser beam 710 is, and easier the workpiece is processed. In other words, in the processing with the laser beam 710, basically, the diameter of the formed hole becomes wider as it is closer to the emission port of the laser beam 710, within the same material.

Furthermore, by horizontally moving the position where the hole is formed, a groove can be formed. In this case, the width of the groove formed becomes wider toward the emission port of the laser beam 710, as in the case of the hole. Conversely, the width of the first groove 711 formed with the laser beam 710 becomes narrower as the distance from the emission port of the laser beam 710 increases. In the synthetic resin layer 112, the width of the first groove 711 formed at a position close to the emission port of the laser beam 710 of the synthetic resin layer 112 is wider than the width of the first groove 711 formed at a position far from the emission port of the laser beam 710.

In FIG. 7A, the wafer 300 and the frame 330 are placed on the adhesive tape 320. In the wafer 300, a multilayer structure includes at least the glass layer 111, the synthetic resin layer 112, the silicon layer 113, and the wiring layer 114. In the first step, the glass layer 111 is placed so as to be in contact with the adhesive tape 320.

The laser-machining in the first step according to the example of the embodiment is performed in a laser-machining device including an emission port (not shown) that emits the laser beam 710 movable in a Z direction, and a processing table that can scan in X, Y, and θ directions (not shown). The wafer 300 and the frame 330 provided with the adhesive tape 320 are fixed to the processing table of the laser-machining device. The first groove 711 is formed along the street 305 of a circuit pattern formed on the surface of the wafer 300 by scanning of the processing table in the X direction with respect to the laser beam 710 emitted from the emission port. The position where a first groove 811 is formed can be changed by moving of the processing table in the Y direction, and moreover, the direction in which the first groove 811 is formed can be changed by rotating of the processing table in the θ direction.

The processing table may further have a fastening part (not shown) capable of fastening the wafer 300 and the frame 330 provided with the adhesive tape 320. In the surface of the fastening part to which the frame 330 is fastened, the area where the wafer 300 is loaded via the adhesive tape 320 has high surface accuracy. Furthermore, the fastening method at the fastening part may be performed by, for example, vacuum-sucking the back of the adhesive tape provided on the frame 330. Thereby, the distance of the wafer 300 from the emission port of the laser beam 710 can be kept constant even when the processing table scans in the X and/or Y directions. That is, the depth of the first groove 711 can be kept constant.

The laser-machining device may have a measuring unit that measures the distance from the surface of the wafer 300 to be scanned, on the emission port side of the laser beam 710. Moreover, the laser-machining device may perform laser-machining by moving the emission port of the laser beam 710 in the Z direction in real time on the basis of the measurement result of the measuring unit. Therefore, even in a case where the distance of the wafer 300 from the emission port of the laser beam 710 changes when the processing table scans in the X and/or Y directions, tracking and moving in the Z direction on the basis of the result measured by the measuring unit allows the above-mentioned distance to be kept constant. That is, the depth of the first groove 711 can be kept more constant.

In the first step according to the example of the embodiment, the laser beam 710 forms the first groove 711 from the surface of the wiring layer 114 to the synthetic resin layer 112 along the street 305 of a circuit pattern formed on the surface of the wiring layer 114 of the wafer 300.

The processing conditions of laser-machining in the first step according to the example of the embodiment are not particularly limited as long as they are generally used for processing silicon, but the wavelength of the laser beam 710 may be, for example, 266 to 1064 nm. By using these wavelengths for the wavelengths of the laser beam 710 of the laser-machining in the first step of the example of the embodiment, the laser beam 710 applied to a workpiece is efficiently absorbed by the wiring layer 304 and the silicon layer 303. The processing conditions of the laser-machining in the first step of the example of the embodiment may be, for example, that the wavelength of the laser beam 710 is 1064 nm, the pulse energy is 10 uJ, and the beam diameter is 20 um.

The laser beam 710 of the laser-machining in the first step according to the example of the embodiment may be emitted in a pulse shape at intervals of time. By emitting the laser beam 710 in a pulse shape, it is possible to reduce the thermal effect on the wiring layer 304 and the silicon layer 303 due to the laser-machining. The pulse width of the laser beam 710 for the laser-machining in the first step of the example of the embodiment may be, for example, a nanosecond width, a picosecond width, or a femtosecond width.

As described above, the first step and the second step according to the example of the embodiment may be performed at the same time. The time required for processing can be thereby shortened. Furthermore, after the first step and before the second step, the wafer 300 may be placed on an adhesive tape having the frame by inverting the front and back sides. By inverting the front and back of the wafer 300 before the second step, the adhesive tape does not exist on the surface to be processed in the second step, and therefore debris generated by laser-machining can be easily discharged from the second groove 721. That is, the quality of processing can be maintained.

In the first step according to the example of the embodiment, the laser-machining may be performed while observing the state of the groove formed with the laser beam 710 in real time. The object to be observed may be, for example, a material in which the laser beam 710 forms the groove, or the position of the bottom face of the groove formed with the laser beam 710.

A method of observing the material in which the groove is being formed in real time may be, for example, observing the induced plasma generated when the material is laser-machined. Furthermore, a method of observing the position of the bottom face of the groove in real time may be, for example, observing a state in which the material is melted and vaporized when the material is laser-machined, or observing resolidified debris after the material is laser-machined. Furthermore, a method of observing the position of the bottom face of the groove may be, for example, a method by laser length measurement.

In the first step and the second step according to the example of the embodiment, a protective film may be formed on at least a part to be groove-formed of the surface to be processed of the wafer 300 before the laser-machining. The material of the protective film may be a solution of a water-soluble material, and may be, for example, an aqueous solution of polyvinyl alcohol (PVA). The protective film is processed together with the wafer 300 when the wafer 300 is laser-machined, and then, can be removed from the wafer 300 together with the debris by washing with water. Therefore, it is possible to prevent the debris generated by the laser-machining from directly adhering to the wafer 300 and solidifying, and it is not necessary to add a new step such as a special cleaning step. That is, the productivity is not reduced.

The thickness of the protective film can be, for example, 2 um. A method for forming the protective film is not particularly limited, but the protective film can be formed by, for example, a spin coating method, a spray coating method, a dip method, or the like.

Figure 7B:
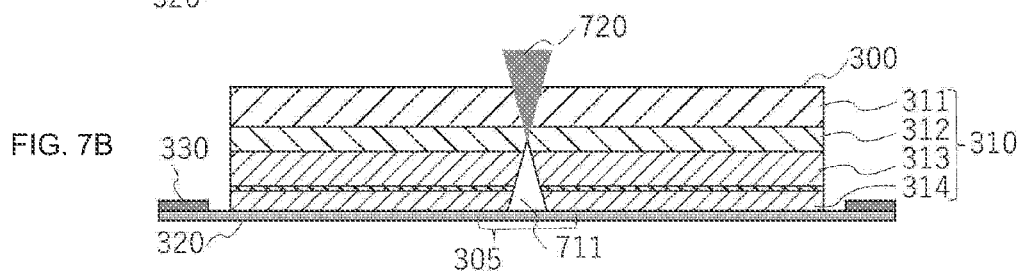
Figure 7C:
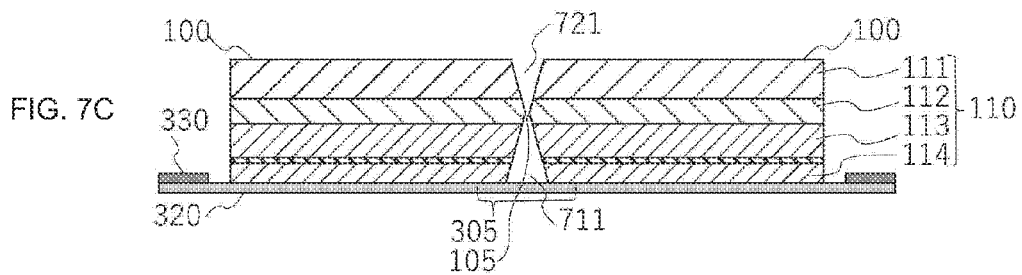

In the second step of the example of the embodiment, a laser beam 720 is applied from the glass layer 111 side, along a circuit pattern formed in the wiring layer 114, or along the first groove 711 formed in the wiring layer 114 or the synthetic resin layer 112 by the first step, and the second groove 721 is formed from the glass layer 111 to the synthetic resin layer 112 (FIG. 7B). The second groove 721 formed in the second step communicates with the groove 712 formed in the first step, so that the wafer 300 is individualized (FIG. 7C).

Here, as with the laser beam 710, as described above, basically, the closer to the emission port, the easier the processing is. That is, the width of the first groove 711 formed with the laser beam 710 becomes narrower as the distance from the emitted light of the laser beam 710 increases. For example, in the synthetic resin layer 112, the shape of the second groove 721 formed with the laser beam 720 is such that the width of the second groove 721 is wide near the emission port of the laser beam 720 and becomes narrower as the distance from the emission port of the laser beam 720 increases. In this way, the second groove 721 is formed in the second step of the example of the embodiment.

The processing conditions of the laser-machining in the second step of the example of the embodiment are not particularly limited as long as the wavelength of the laser beam 720 is generally used for laser-processing for a glass material and the like, but the laser beam 720 may have, for example, a wavelength of 1064 nm, a pulse energy of 30 uJ, and a beam diameter of 20 um. In addition, since the principle of laser-machining with the laser beam 720 is basically the same as that of laser-machining with the laser beam 710, the description thereof will be omitted.

Figure 8A:
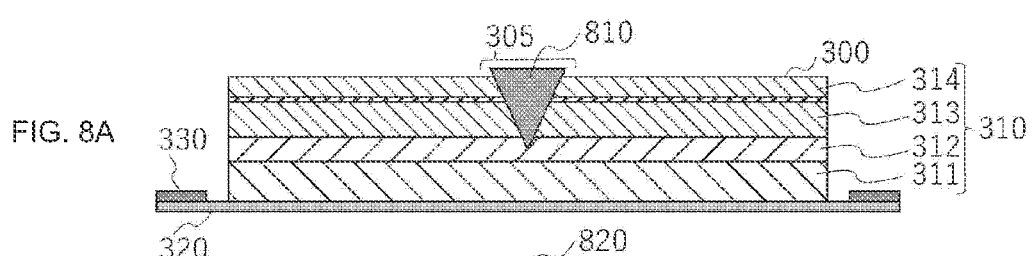
FIGS. 8A, 8B, and 8C are diagrams showing a modification of the method of manufacturing the semiconductor package according to the first embodiment according to the present technology.
Figure 8B:
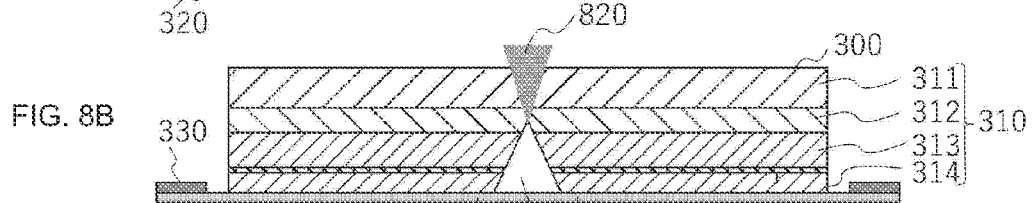
Figure 8C:
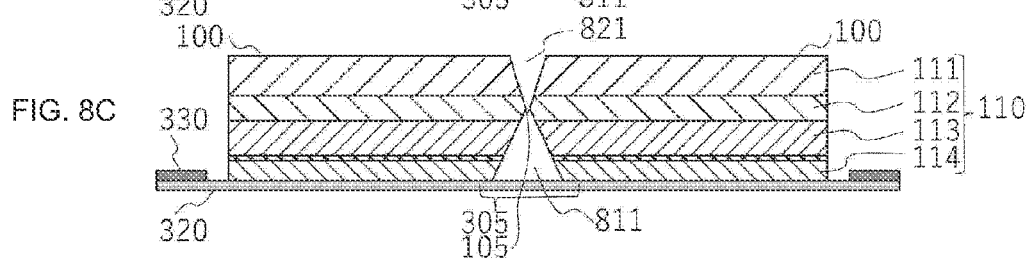

7. A Modification of the Method of Manufacturing the Semiconductor Package of the First Embodiment A modification of the method of manufacturing the semiconductor package according to the present technology will be described below with reference to FIGS. 8A 8B, and 8C. In FIG. 8A, the wafer 300 and the frame 330 are placed on the adhesive tape 320. Since the configuration of the wafer 300 is the same as that described in the example of the method of manufacturing the semiconductor package of the first embodiment described above, the description thereof will be omitted. In a first step, on the wafer 300, a first groove 811 is formed, which reaches from the surface of the wiring layer 314 to the synthetic resin layer 312, along the street 305 of a circuit pattern formed on the surface of the wiring layer 314, with a grindstone blade 810 attached to a spindle that rotates at high speed.

The grindstone-machining in the first step according to the modification of the embodiment is performed in a device including the grindstone blade 810 attached to a spindle that can rotate at high speed and a processing table that can scan in X, Y, and θ directions (not shown). The wafer 300 and the frame 330 provided with the adhesive tape 320 are fixed to the processing table of the device. The first groove 811 is formed in the street 305 of a circuit pattern formed on the surface of the wafer 300 by scanning of the processing table in the X direction with respect to the grindstone blade 810 rotating at high-speed. The position of the street 305 forming the first groove 811 can be changed by scanning of the processing table in the Y direction, and moreover, the direction in which the first groove 811 is formed can be changed by scanning of the processing table in the θ direction.

The grindstone blade 810 used in the grindstone-machining in the first step according to the modification of the embodiment is preliminarily finished in a tapered shape such that the cross-sectional shape of the blade becomes thinner toward the outermost circumference of the blade. Therefore, the first groove 811 formed with the grindstone blade 810 has a shape such that the first groove 811 formed in the wiring layer 314 has a wide width and the first groove 811 formed in the synthetic resin layer 312 has a narrow width.

The formation of the first groove 811 by the grindstone-machining in the first step according to the modification of the embodiment may be performed by only single scanning or multiple scanning of the wafer 300 with respect to the grindstone blade 810 rotating at high speed. For example, the depth of the groove formed may be deepened every time of the scanning.

In the grindstone-machining in the first step according to the modification of the embodiment, the grindstone blade 810 used may be, for example, the one made by kneading diamond abrasive grains with a binder and the like, forming the mixture into a disk shaped preform, and firing the preform. By using the grindstone blade 810 including diamond abrasive grains and a binder for grindstone-machining, even in a case where the diamond abrasive grains are worn by processing a workpiece, the diamond abrasive grains fall off and the processing can be continued with new diamond abrasive grains. Therefore, the quality and speed of the grindstone-machining can be maintained constant. In this way, even if the grindstone is worn by the grindstone-machining, the abrasive grains fall off by themselves and the grindstone-machining is performed with the new grindstone, which is called self-sharpening. The grindstone blade 810 may have a diameter of 7.5 cm or less and a thickness of 10 um to 100 um, for example.

In the grindstone-machining in the first step according to the modification of the embodiment, a spindle to which the grindstone blade 810 is attached may be, for example, the one that rotates at a maximum of 100,000 rpm due to the rotation of a motor. The processing conditions of the grindstone-machining in the first step according to the modification of the embodiment can be, for example, that the rotation speed of the spindle is 3500 rpm and the moving speed of the processing table in the X-axis direction is 30 mm/sec.

The grindstone-machining in the first step according to the modification of the embodiment may be further performed with machining-water flowing to the processing point between the grindstone blade and a workpiece during the grindstone-machining. With machining-water flowing to the processing point, processing debris generated from the workpiece by the grindstone-machining can be removed, as well as the heat generated by the friction between the grindstone blade 810 rotating at high speed and the workpiece can be removed. Therefore, the quality of machining can be ensured.

The treatment after the first step according to the modification of the embodiment is similar to that described in the above-described example of the embodiment. That is, in a second step, a second groove 821 is formed from the glass layer 311 to the synthetic resin layer 312 by a laser beam 820 from the surface of the glass layer 311 side and communicates with the first groove 811, so that the wafer 300 is individualized and the semiconductor package 100 is formed.

In the second step according to the modification of the embodiment, the second groove 721 may be formed not only by the laser-machining but also by the grindstone-machining. The processing conditions of the grindstone-machining in the second step according to the example of the embodiment can be, for example, that the rotation speed of the spindle is 2500 rpm and the moving speed of the processing table in the X-axis direction is 20 mm/sec.

Figure 9A:
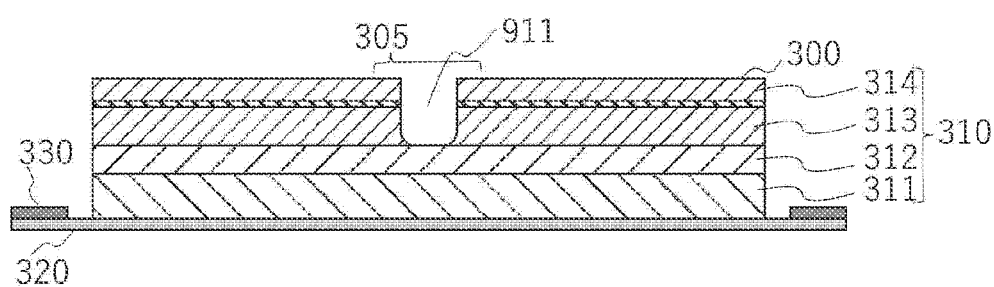
FIGS. 9A, 9B, and 9C are diagrams showing an example of a method of manufacturing the semiconductor package according to the second embodiment of the present technology.

8. An Example of a Method of Manufacturing the Semiconductor Package of the Second Embodiment A method of manufacturing the semiconductor package according to the present technology will be described below with reference to FIGS. 9A, 9B, and 9C. In FIG. 9A, the wafer 300 and the frame 330 are placed on the adhesive tape 320. Since the configuration of the wafer 300 is the same as that described in the above-described example of the method of manufacturing the semiconductor package of the first embodiment, the description thereof will be omitted.

In a first step according to an example of the embodiment of the present technology, a first groove 911 is formed in the wiring layer 314 and the silicon layer 313 along the street 305 on the surface of the wiring layer 314 by wet-etching.

The etching solution used for the wet-etching may be anything that is generally used for wet-etching for silicon materials and the like in the art and is not particularly limited, but preferably, it is desirable to have properties such as crystal orientation dependence of etching rate, selectivity with a material used as a protective film for etching, compatibility with an LSI process, and low toxicity and easy handling. The crystal orientation dependence of the etching solution allows a work material to be deeply wet-etched in the direction of a specific crystal orientation.

As the etching solution having crystal anisotropy with respect to silicon used in the wet-etching, aqueous solutions of potassium hydroxide (KOH), sodium hydroxide (NaOH), ethylenediamine/pyrocatechol (EDP), hydrazine (N2H4), ammonium hydroxide (NH4OH), and tetramethylammonium hydroxide (TMAH; (CH3) 4NOH) are preferably used. Among these, from the viewpoint of compatibility with the LSI process, ammonium hydroxide and tetramethylammonium hydroxide are particularly excellent as the etching solution used for the silicon wet-etching. Moreover, as the etching solution used for the silicon wet-etching, an aqueous solution of tetramethylammonium hydroxide, which is non-volatile, less toxic, and easy to handle, is excellent. The etching solution used for the silicon wet-etching may be, for example, a 25 wt % aqueous solution of tetramethylammonium oxide at 60° C.

Before the wet-etching, a protective film is applied to the surface of the wiring layer 314. The wet-etching may be performed after the part of the protective film corresponding to the street 305 of a circuit pattern formed on the surface of the wiring layer 314 is exposed to light by lithography, and the exposed part of the protective film is incinerated and removed by plasma processing, or after the protective film of the processing allowance part of a circuit pattern formed on the wiring layer 314 is removed with an electron beam or the like. Alternatively, the wet-etching may be performed after a protective film is formed on the surface of the wiring layer 314 except for the street 305 of a circuit pattern formed by using nanoimprint technology and plasma-processed.

The processing after the first step is similar to that described in the above-described example of the method of manufacturing the semiconductor package of the first embodiment and will be therefore omitted. That is, in a second step, a second groove 921 is formed from the glass layer 311 to the synthetic resin layer 312 with a laser beam 920 from the surface of the glass layer 311 side, and the second groove 921 communicates with the first groove 911, so that individualization is performed and the semiconductor package 200 is formed.

Here, with respect to the end face of the semiconductor package 200, the shape of the bottom face of the first groove 911 formed by the wet-etching is generally a shape having a substantially R shape at the corner portion. This is because the circulation of an etchant is not sufficient near the bottom face of the first groove 911 as compared with the other parts of the first groove 911, so that the processing efficiency is lowered. In a case where the processing time is lengthened to compensate for the decrease in processing efficiency near the bottom face of the first groove 911, since the wet-etching is isotropic, the processing of other parts of the first groove 911 will also proceed, and the performance of the semiconductor package 200 may be affected. Therefore, in general, the processing will be stopped at the time of obtaining the shape of the first groove 911 to some extent. That is, in general, the shape of the bottom face of the first groove 911 formed by wet-etching is a shape having an R shape at the corner.

Note that the synthetic resin layer 312 may be wet-etched when the first groove 911 is formed.

Figure 9B:
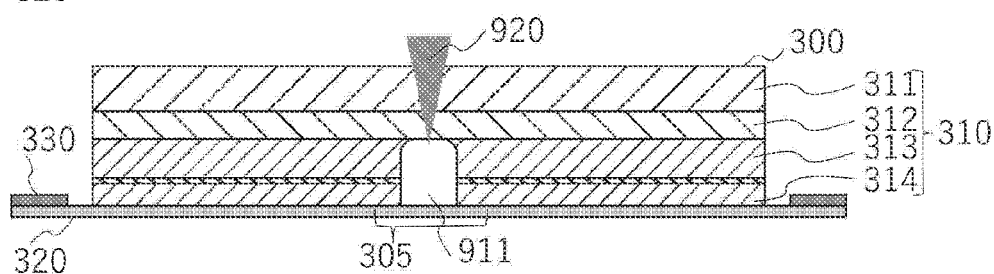
Figure 9C:
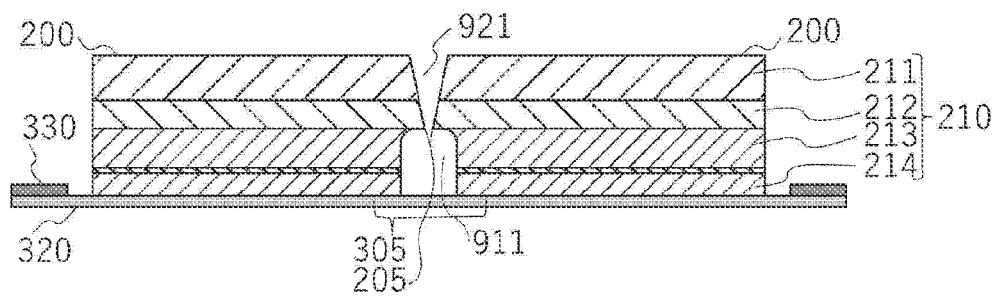

FIGS. 9A, 9B, and 9C show diagrams in a case where the first groove 911 is formed by the wet-etching in the first step and the second groove 921 is formed by the laser-machining in the second step, but without limiting to this, the second groove 921 may be formed by the wet-etching in the second step. In a case where the second groove 921 is formed by the wet-etching in the second step, the shape of the second groove 921 will be similar to that of the first groove 911, which has an R shape at the corner of the bottom face. Furthermore, in a case where the second groove 921 is formed by the wet-etching in the second step, the synthetic resin layer 212 may be wet-etched when the first groove 911 is formed in the first step and/or the second groove 921 is formed in the second step. Moreover, in a case where the second groove 921 is formed by wet-etching in the second step, the deepest portion of the first groove 911 and the second groove 921 may communicate with each other.

Note that the present technology can also have the following configuration.

[1] A semiconductor package that includes a multilayer structure having at least a synthetic resin layer and includes an outermost edge portion such that an end face of the synthetic resin layer protrudes outward compared to the end faces of the other layers.

[2] A semiconductor package that includes a multilayer structure having at least a synthetic resin layer and includes an outermost edge portion such that an end face of the synthetic resin layer protrudes outward compared to the end faces of the other layers of the multilayer structure.

[3] The semiconductor package according to [1] and [2], including the synthetic resin layer between a glass layer and a silicon layer.

[4] The semiconductor package according to [1] and [2], including the synthetic resin layer between a glass layer and a silicon layer constituting the multilayer structure.

[5] A transport tray for a semiconductor package in which a plurality of storage parts that stores the semiconductor package according to [1] to [4] is arranged, and the storage parts store the semiconductor package.

[6] A method of manufacturing a semiconductor package, in which individualization is performed by a first step where a first groove is formed from one surface of a wafer to the synthetic resin layer, and by a second step where a second groove is formed from the other surface of the wafer until the second groove communicates with the deepest portion of the groove of the synthetic resin layer so that the end face of the synthetic resin layer includes an outermost edge portion protruding outward compared to the end faces of the other layers.

[7] A method of manufacturing a semiconductor package, in which individualization is performed by a first step where a first groove is formed from one surface of a wafer to the synthetic resin layer, and by a second step where a second groove is formed from the other surface of the wafer until the second groove communicates with the deepest portion of the groove of the synthetic resin layer so that the end face of the synthetic resin layer includes an outermost edge portion protruding outward compared to the end faces of the other layers constituting the multilayer structure.

[8] A method of manufacturing a semiconductor package, in which, by a first step where a first groove is formed from one surface of a wafer to the synthetic resin layer, and by a second step where a second groove is formed from the other surface of the wafer until the second groove communicates with the deepest portion of the groove of the synthetic resin layer, an outermost edge portion protruding outward compared to the end faces of the other layers constituting the multilayer structure is formed in the end face of the synthetic resin layer, and the wafer is individualized.

[9] The method of manufacturing a semiconductor package according to [6] to [8], in which the first groove of the first step and the second groove of the second step are formed by any one of or a combination of laser-machining, grindstone-machining and wet-etching.

REFERENCE SIGNS LIST

100, 200 Semiconductor package
110, 210, 310 Multilayer structure
111, 211, 311 Glass layer
112, 212, 312 Synthetic resin layer
113, 213, 313 Silicon layer
114, 214, 314 Wiring layer
105, 205 Outermost edge portion

The invention claimed is:

1. A semiconductor package, comprising:
   a multilayer structure having at least a synthetic resin layer, wherein the synthetic resin layer is between a glass layer and a silicon layer; and
   an outermost edge portion, wherein an end face of the synthetic resin layer protrudes outward compared to end faces of other layers.

2. A transport tray, comprising
   a plurality of storage parts configured to store a semiconductor package that comprises:
   a multilayer structure having at least a synthetic resin layer, wherein the synthetic resin layer is between a glass layer and a silicon layer; and
   an outermost edge portion, wherein an end face of the synthetic resin layer protrudes outward compared to end faces of other layers.

* * * * *